(12) United States Patent
Gondo

(10) Patent No.: US 7,864,075 B2
(45) Date of Patent: Jan. 4, 2011

(54) ROTARY ELECTROSTATIC ENCODER

(75) Inventor: Masahiko Gondo, Uenohara (JP)

(73) Assignee: Seidensha Corporation, Kanagawa (JP)

( * ) Notice: Subject to any disclaimer, the term of this patent is extended or adjusted under 35 U.S.C. 154(b) by 78 days.

(21) Appl. No.: 12/418,844

(22) Filed: Apr. 6, 2009

(65) Prior Publication Data

US 2010/0045489 A1 Feb. 25, 2010

(30) Foreign Application Priority Data

Aug. 20, 2008 (JP) .............................. 2008-211337

(51) Int. Cl.
*H03M 1/22* (2006.01)
(52) U.S. Cl. ........................... 341/15; 341/11; 341/112; 341/116
(58) Field of Classification Search .................. 341/9, 341/11, 13, 15, 112, 116
See application file for complete search history.

(56) References Cited

U.S. PATENT DOCUMENTS 6,492,911 B1 * 12/2002 Netzer .................. 340/870.37
7,259,695 B2 * 8/2007 Andermo ...................... 341/15

FOREIGN PATENT DOCUMENTS

| JP | 08-233605 | 9/1996 |
| JP | 2002-542476 | 12/2002 |
| JP | 2005-221472 | 8/2005 |

* cited by examiner

*Primary Examiner*—Kahi M Nguyen
(74) *Attorney, Agent, or Firm*—Antonelli, Terry, Stout & Kraus, LLP.

(57) ABSTRACT

A rotary electrostatic encoder comprising a disk-shaped fixed plate having a first transmission electrode, a second transmission electrode, and four reception electrodes; a disk-shaped rotating plate having a first induction electrode superposed on and facing the first transmission electrode, and a second induction electrode positioned on the inside of the first induction electrode and superposed on and facing the second transmission electrode, a portion of the second induction electrode being a protruding eccentric circular part; transmission means for applying a transmission signal between the first transmission electrode and the second transmission electrode; and signal processing means for generating an output signal relating to the absolute rotational displacement of the rotating plate on the basis of two signal components generated from the four reception electrodes.

10 Claims, 15 Drawing Sheets

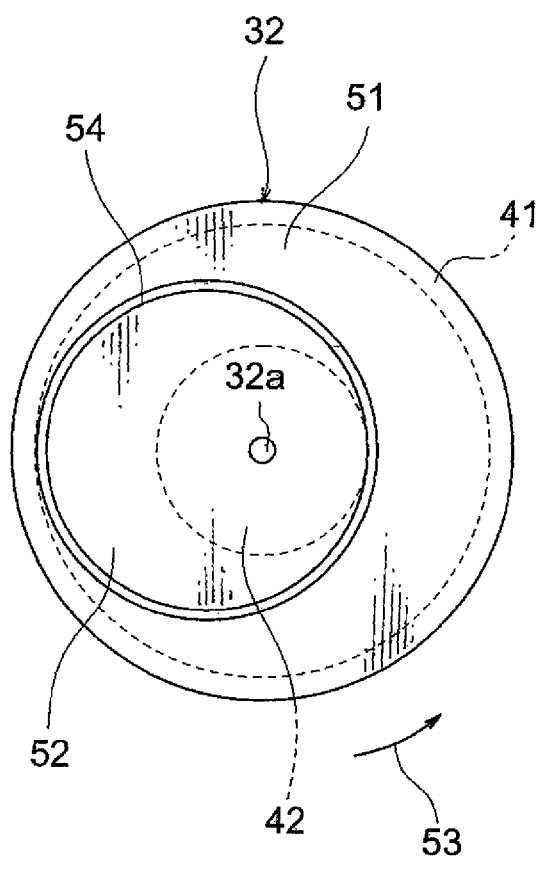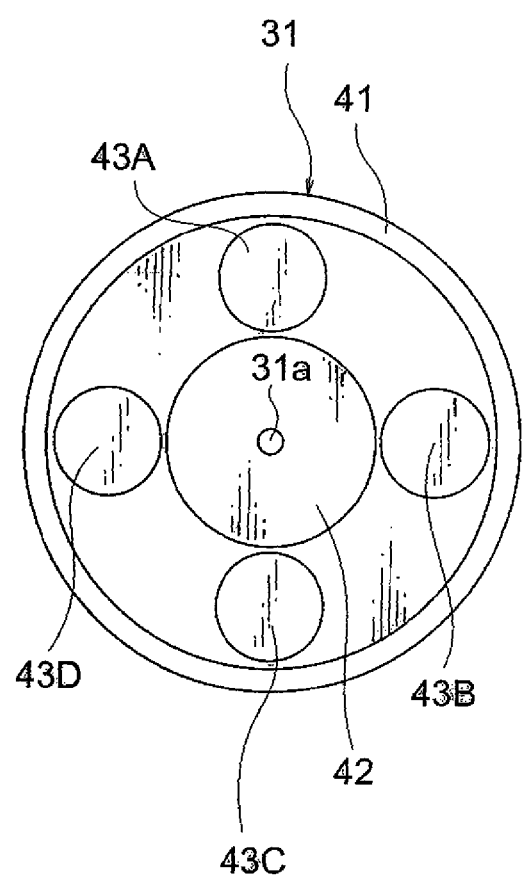

ROTARY ELECTROSTATIC ENCODER

BACKGROUND OF THE INVENTION

1. Field of the Invention

The present invention relates to a rotary electrostatic encoder, and particularly relates to an absolute-type rotary electrostatic encoder that has a simple structure and is capable of obtaining an absolute angle.

2. Description of the Related Art

An example of a conventional electrostatic encoder is disclosed in Japanese Laid-open Patent Publication No. 2005-221472. The electrostatic encoder disclosed in this document is provided with a moving element that moves in relation to a fixed element, and has a structure capable of measuring the position of the moving element. In the electrostatic encoder, the fixed element is formed as a plate-shaped member having an induction electrode and a potential detection electrode, and the moving element on the other side is formed as a plate-shaped member having an electrode. The plate-shaped moving element is placed over the plate-shaped fixed element, and the moving element is provided so as to move along the fixed element in a state of being superposed on the fixed element. The sensor unit of the electrostatic encoder is thus formed. The sensor unit of the electrostatic encoder disclosed in Japanese Laid-open Patent Publication No. 2005-221472 has a thin profile and can be made in a small size.

A related conventional technique is the capacitive displacement encoder disclosed in PCT (WO) 2002-542476. This capacitive displacement encoder has a mechanism for sensing the rotation position of a disk-shaped moving body in relation to a disk-shaped static body. This mechanism is composed of at least one static element that is connected to a static body, and a moving element that is connected to a moving body in the vicinity of the static element. An electric field transmission device is provided for generating an electrostatic field. The electrostatic field is modulated by a capacitance change that occurs between the two elements in conjunction with relative rotational movement between the static element and the moving element. A processing circuit senses the modulated electrostatic field, and in response, determines the measured position of the moving body.

In PCT (WO) 2002-542476, the configuration shown in FIG. 2 detects the angle of a rotor. In this configuration, four phases of signals are fed to four electrodes provided 90 degrees apart on the stator side, thus driving the electrodes, and the signals are received by an eccentric electrode in the rotor. The angle of the rotor is detected by detecting the phase of the received signals. The configuration shown in FIG. 7 of the technique disclosed in PCT (WO) 2002-542476 has a three-plane structure formed by providing two stators with a rotor in between the two stators. An inner ring electrode and an outer ring electrode are formed concentrically on the opposing surface of one stator. In the outer ring electrode, four electrodes are formed 90 degrees apart. An inner ring electrode and an outer ring electrode are formed concentrically on the opposing surface of the other stator. Four-phase driving is performed for the four electrodes in the stator. The rotor positioned between the two stators is formed by a type of electrostatic shield, and the electrostatic shield has an eccentric electrode structure. A reception signal is read from the other stator described above. Since the electrostatic shield member of the rotor is eccentric, the phase of the reception signal varies in the range of 0 to 360 degrees according to rotation.

Another related conventional technique is the electrostatic capacitance encoder disclosed in Japanese Laid-open Patent Publication No. 08-233605. This electrostatic capacitance encoder has a structure in which the sensor unit is formed by two disk-shaped stators. The stators have a transmission electrode positioned in the center thereof, and twelve reception electrodes arranged at an interval on the periphery of the transmission electrode so that a three-phase reception signal is obtained. The rotor has a gear-shaped electrode that protrudes at an interval in four directions.

The capacitive displacement encoder disclosed in PCT (WO) 2002-542476 has the following drawbacks. Since the rotary sensor unit has a three-plane structure (sandwich structure) composed of two stators and one rotor, there are a large number of parts, and the structure is complex. A configuration is also adopted therein in which the electrostatic capacitance between the two stators is varied by the electrostatic shielding capability of the rotor. A ring-shaped electrode for providing a virtual ground must therefore be provided for each of the two stators positioned on both sides of the rotors. A buffer amplifier (indicated by reference numeral 182 of FIG. 7 of PCT (WO) 2002-542476) for potential control (virtual grounding) is also provided to the inner ring electrodes of the two stators. The electrode structure is therefore complex, and a circuit is required to stabilize the potential of the reception electrode.

In the electrostatic capacitance encoder disclosed in Japanese Laid-open Patent Publication No. 08-233605, an alternating-current power supply is connected between the transmission electrode and the ground, and a transmission signal is presented to the transmission electrode. However, since the ground is never connected to the electrodes of the rotor and the stator, it is unknown whether the ground actually has an effect.

SUMMARY OF THE INVENTION

An object of the present invention is to provide a rotary electrostatic encoder that is an electrostatic encoder for detecting angle information by an electrostatic effect, the sensor unit having a rotary structure, wherein the rotary-structured sensor unit has a simple structure and can obtain an absolute angle, has a stable circuit unit and can obtain accurate angle information, and is highly practical and has high resolution and an extremely thin profile, and the number of cables can be reduced in the rotary electrostatic encoder.

The rotary electrostatic encoder of the present invention is configured as follows in order to achieve the abovementioned objects.

The rotary electrostatic encoder comprises a disk-shaped fixed element having a first transmission electrode disposed in an external peripheral part; a second transmission electrode disposed in a center part; and four reception electrodes disposed at intervals at 90-degree angles in the circumferential direction between the first transmission electrode and the second transmission electrode. The rotary electrostatic encoder also comprises a disk-shaped rotating element provided parallel and rotatable with respect to the fixed element, the rotating element having a first induction electrode superposed on and facing the first transmission electrode, a portion of the first induction electrode being a protruding eccentric perforated external peripheral part; and a second induction electrode positioned on the inside of the first induction electrode and superposed on and facing the second transmission electrode, a portion of the second induction electrode being a protruding eccentric circular part. The rotary electrostatic encoder also comprises transmission means for applying a transmission signal to the first transmission electrode and the second transmission electrode of the fixed element; and signal processing means for generating an output signal relating to the absolute rotational displacement of the rotating element on the basis of two signal components outputted from the four reception electrodes of the fixed element.

According to the rotary electrostatic encoder described above, the rotation angle of the rotating element with respect to the fixed element can be read as an absolute angle. A charge induction effect is created between the electrode arrangement pattern of the transmission electrodes and reception electrodes on the fixed-element side and the electrode arrangement pattern of the induction electrodes on the rotating-element side, and the induction electrodes on the rotating-element side are endowed with an eccentric shape, whereby the electrode opposing state or the shape of the opposing portions during rotation of the rotating element is uniquely determined according to the rotation angle. The relative rotation angle state is thereby detected and read as absolute angle information.

In the rotary electrostatic encoder, a charge is induced in the first induction electrode and the second induction electrode on the basis of the transmission signal applied between the first transmission electrode and the second transmission electrode, and a potential based on the charge is detected by the four reception electrodes.

In the rotary electrostatic encoder, the signal processing means comprises a resolver/digital converter for converting the two signal components to an angle signal.

In the rotary electrostatic encoder, the signal processing means comprises a circuit for performing synchronous detection of the two signal components at the frequency of the transmission signal outputted from the transmission means and removing a carrier wave component; and a phase division circuit for detecting a vector rotation angle on the basis of the two signal components from which the carrier wave component has been removed.

In the rotary electrostatic encoder, the surface area of the first transmission electrode and the surface area of the second transmission electrode in the fixed element are substantially the same.

In the rotary electrostatic encoder, a first differential amplifier to which reception signals from the first and third reception electrodes of the four reception electrodes are inputted, a second differential amplifier to which reception signals from the second and fourth reception electrodes are inputted, and a converter for generating a power supply voltage of the first and second differential amplifiers from the transmission signal are provided in the vicinity of the fixed element.

In the rotary electrostatic encoder, a motor output shaft attachment mechanism is provided to the rotating element, and the fixed element, the rotating element, the transmission means, and the signal processing means are built into a single case.

The rotary electrostatic encoder of the present invention comprises a disk-shaped fixed element having a first reception electrode disposed in an external peripheral part; a second reception electrode disposed in a center part; and four transmission electrodes disposed at intervals at 90-degree angles in the circumferential direction between the first reception electrode and the second reception electrode. The other aspect of the rotary electrostatic encoder also comprises a disk-shaped rotating element provided parallel and rotatable with respect to the fixed element, the rotating element having a first induction electrode superposed on and facing the first reception electrode, a portion of the first induction electrode being a protruding eccentric perforated external peripheral part; and a second induction electrode positioned on the inside of the first reception electrode and superposed on and facing the second reception electrode, a portion of the second induction electrode being a protruding eccentric circular part. The other aspect of the rotary electrostatic encoder also comprises transmission means for applying a four-phase transmission signal to the four transmission electrodes of the fixed element; and signal processing means for detecting one reception signal from the first and second reception electrodes of the fixed element, performing quadrature detection of the reception signal, and detecting the rotation angle of the rotating element by a vector component of the reception signal.

In this configuration, the transmission electrodes and reception electrodes previously described in the fixed element have completely opposite roles.

The rotary electrostatic encoder of the present invention comprises a fixed element having a first transmission electrode disposed in an external peripheral part, a second transmission electrode disposed in a center part, and a plurality of reception electrodes; a rotating element having a first induction electrode and a second induction electrode in which a relative shape facing the reception electrodes varies according to a rotation angle; and transmission means for applying a transmission signal to the first transmission electrode and the second transmission electrode of the fixed element. A charge is induced in the first induction electrode and the second induction electrode by electrostatic induction based on the first transmission electrode and the second transmission electrode, potentials that thereby occur in the first induction electrode and the second induction electrode are detected by the plurality of reception electrodes, and an output signal relating to the rotation angle is generated.

In this configuration, a potential that occurs based on a plus charge or a minus charge electrostatically induced in the first and second induction electrodes is detected through the reception electrodes.

The rotary electrostatic encoder comprises a first electrode plate having a first transmission electrode disposed in an external peripheral part, a second transmission electrode disposed in a center part, and a plurality of reception electrodes disposed between the first transmission electrode and the second transmission electrode; and a second electrode plate having a first induction electrode superposed on and facing the first transmission electrode, a portion of the first induction electrode being a protruding eccentric perforated external peripheral part; and a second induction electrode positioned on the inside of the first induction electrode and superposed on and facing the second transmission electrode, a portion of the second induction electrode being a protruding eccentric circular part. The first electrode plate and the second electrode plate are in a positional relationship of being on the same axis and rotating relative to each other; and a predetermined charge induction state is generated in the four reception electrodes according to the relative rotation position of the first and second electrode plates and on the basis of a charge distribution state generated in the first and second transmission electrodes by an applied transmission signal, and a sympathetic charge distribution state of the first and second induction electrodes. A signal relating to the absolute rotational displacement between of the first and second electrode plates is generated based on two signal components outputted from the four reception electrodes.

In this configuration, a fixed element and a rotating element are not determined, and any of the first and second electrode plates can be a fixed element or a rotating element on the basis of the relationship of the first and second electrode plates to each other. However, when the first electrode plate to which the transmission signal is applied is designated as the rotating element, an electrical connection part must be provided for feeding the transmission signal to the rotating portion.

The following effects are demonstrated by the rotary electrostatic encoder of the present invention.

First, the sensor unit can be created by two plate members as the fixed element and the rotating element, and a sensor unit having a simple rotary structure can therefore be obtained. Rotation angle information of the rotating element can also be obtained as an absolute angle on the basis of the electrostatic induction effect between the induction electrodes formed on the opposing surface of the rotating-element side and the transmission electrodes and reception electrodes formed on the opposing surface of the fixed-element side.

Second, two signal components are obtained from the four reception electrodes of the fixed element, and the rotation angle of the rotating element is read as an absolute value from the signal components by processing using a resolver/digital converter or the like, for example. Accurate angle information can therefore be obtained by a stable signal processing circuit unit.

Third, the sensor unit and the electronic circuit unit can be made small and compact, a high resolution of 1024 to 4096 divisions in one rotation can be obtained, and a high degree of practicality is obtained.

Fourth, since the rotary electrostatic encoder has a two-electrode-plate structure, an extremely thin profile can be obtained.

Fifth, the number of cables can be reduced, the sensor unit can be endowed with an extremely thin profile and used in an endoscope or the like, for example, and the sensor unit can also be directly attached to a motor output shaft and built into a small or confined location.

BRIEF DESCRIPTION OF THE DRAWINGS

The aforementioned objects and characteristics of the present invention are apparent from the following description of preferred embodiments given with reference to the attached drawings, wherein:

FIGS. 4A and 4B are diagrams showing the arrangement pattern of the electrodes of the fixed plate and the rotating plate;

DESCRIPTION OF THE PREFERRED EMBODIMENTS

Preferred embodiments of the present invention will be described below with reference to the accompanying drawings.

The mechanical structure of the rotary electrostatic encoder of the present invention will be described with reference to FIGS. 1 through 3. The configuration shown in FIGS. 1 through 3 is merely an example and does not limit the present invention.

Figure 1:
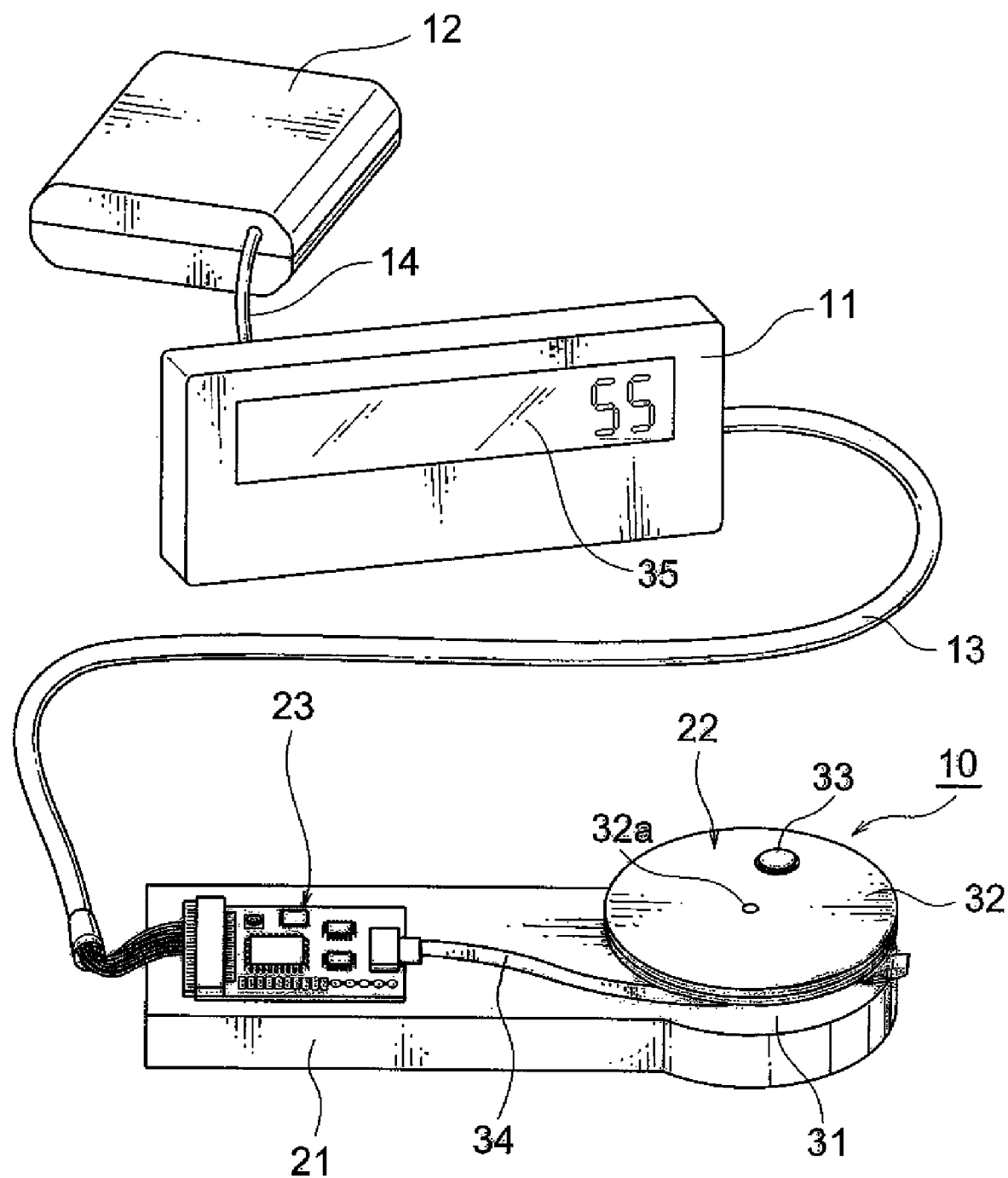
FIG. 1 is a perspective view showing the overall configuration of an embodiment of the rotary electrostatic encoder of the present invention.
Figure 2:
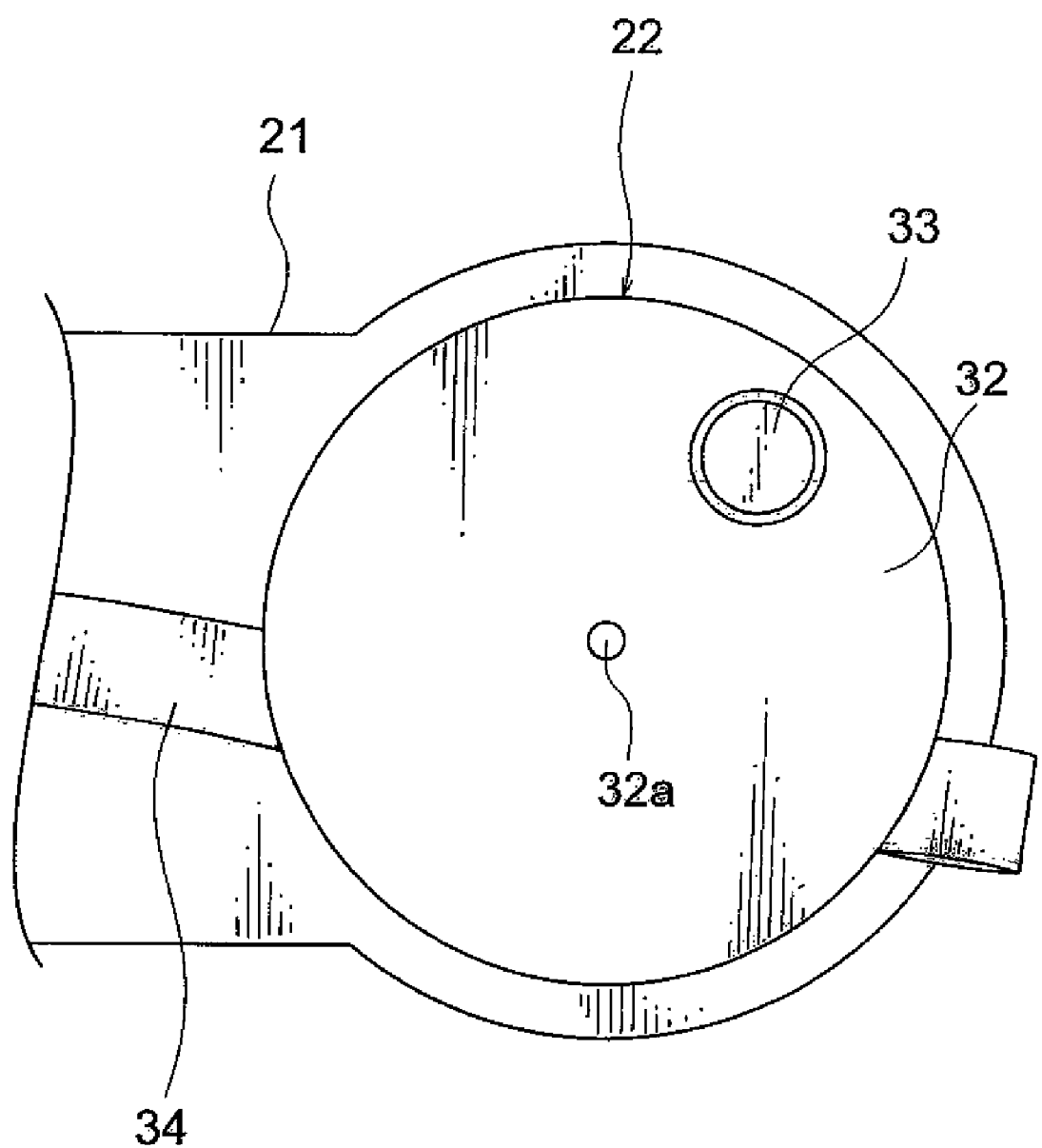
FIG. 2 is a plan view showing the sensor unit of the rotary electrostatic encoder of the present embodiment.

In FIG. 1, the reference numeral 10 refers to the device main body of the rotary electrostatic encoder, 11 refers to a display device for displaying measurement content, and 12 is a battery for supplying electrical power for enabling operation of the device main body 10 and the display device 11. The device main body 10 and the display device 11 are connected by a cable 13. A power transmission line 14 from the battery 12 is connected to the device main body 10 and the display device 11. A power transmission line to the device main body 10 is provided in the cable 13.

In an example configuration, the device main body 10 has a stage 21, and on the stage 21 are provided a sensor unit 22, and an electronic circuit unit 23 for presenting a necessary transmission signal (voltage signal) to the sensor unit 22 and processing a detection reception signal outputted from the sensor unit 22.

Figure 3:
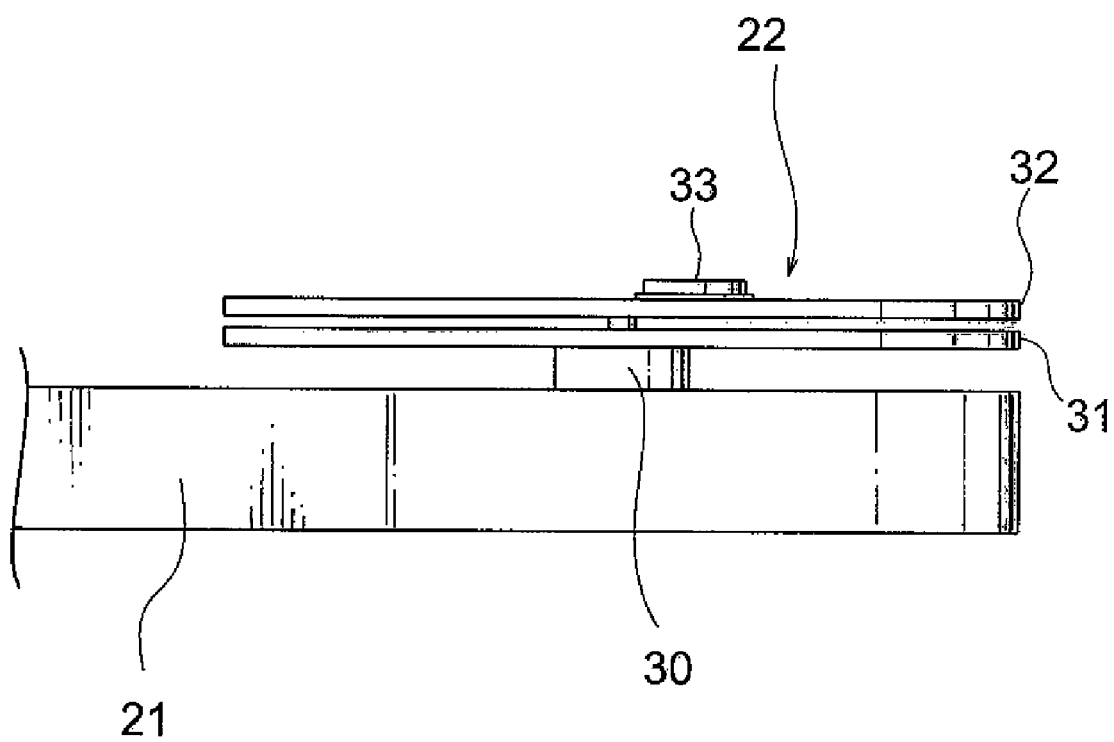
FIG. 3 is a side view showing the sensor unit of the rotary electrostatic encoder of the present embodiment.

As shown in FIGS. 1 and 3, the sensor unit 22 is composed of a disk-shaped fixed plate 31 positioned on a lower side and fixed to the stage 21 by a support shaft 30, and a disk-shaped rotating plate 32 positioned on the upper side and provided so as to be able to rotate about a shaft 32a. The fixed plate 31 and the rotating plate 32 are disk shaped and have substantially the same diameter, and are arranged substantially parallel to each other and facing each other across a required gap so that the centers thereof coincide with each other. The fixed plate 31 and the rotating plate 32 are both made of an insulating material, and a plurality of electrodes is also formed in a predetermined pattern such as described hereinafter on the opposing surfaces of the fixed plate 31 and the rotating plate 32. The rotating plate 32 can be rotated to any rotation angle with respect to the fixed plate 31 that is fixed to the stage 21. A protruding part 33 with which a finger is brought into contact to provide rotational force when rotating the rotating plate 32 is provided to the upper surface of the rotating plate 32.

The electronic circuit unit 23 is provided with a transmission circuit for feeding a transmission signal to a transmission electrode formed on the fixed plate 31, and a signal processing circuit for processing a reception signal obtained from a reception electrode formed on the fixed plate 31. A flat cable 34 is connected between the electronic circuit unit 23 and the electrodes of the fixed plate 31.

The display device 11 is provided with a display unit 35 for showing a digital display of information relating to a rotation angle (absolute angle) detected by the sensor unit 22 of the device main body 10.

The electrodes formed on the opposing surfaces of the fixed plate 31 and rotating plate 32 of the sensor unit 22 will next be described with reference to FIGS. 4A and 4B. FIG. 4A shows the electrode pattern of the rotating plate 32, and FIG. 4B shows the electrode pattern of the fixed plate 31. These electrode patterns are formed as conductive films on the opposing surfaces of the fixed plate 31 and the rotating plate 32 formed by an insulating material.

First, in the electrode pattern of the fixed plate 31 shown in FIG. 4B, a ring-shaped electrode 41 is provided that is arranged along the entire peripheral edge of the external peripheral part of the round fixed plate 31, and a circular electrode 42 is provided at the center of the fixed plate 31. The electrode 41 of the external peripheral part is a first transmission electrode, and the electrode 42 in the center is a second transmission electrode. A transmission signal is fed to the two transmission electrodes 41, 42. Four circular electrodes 43A, 43B, 43C, 43D are provided between the two transmission electrodes 41, 42. The four electrodes 43A through 43D are arranged at equal intervals in positions 90 degrees apart in the circumferential direction around the center 31 of the fixed plate 31. These four electrodes 43A through 43D are reception electrodes. The area of the opposing surface of the fixed plate 31 in which the transmission electrodes 41, 42 and reception electrodes 43A through 43D are not formed is an insulator surface.

The electrode pattern of the rotating plate 32 shown in FIG. 4A is provided with a first induction electrode 51 superposed on and facing the first transmission electrode 41, a portion of the first induction electrode 51 being a protruding eccentric perforated external peripheral part; and a second induction electrode 52 positioned on the inside of the first induction electrode 51 and superposed on and facing the second transmission electrode 42, a portion of the second induction electrode 52 being a protruding eccentric circular part. The first induction electrode 51 is in a state in which the peripheral edge portion thereof is always superposed on and facing the first transmission electrode 41 along the entire periphery, as shown in FIG. 4A. The second induction electrode 52 has a circular shape, but is arranged in an eccentric position with respect to the center 32a of the rotating plate 32. Therefore, the second induction electrode 52 is in a state in which the eccentric center portion thereof is always superposed on and facing the second transmission electrode 42, as shown in FIG. 4A. This relationship always exists even when the rotating plate 32 is rotated in the direction of the arrow 53 (the counterclockwise direction), for example, with respect to the fixed plate 31. However, the relationship in which the four reception electrodes 43A through 43D of the fixed plate 31, and the first induction electrode 51 and the second induction electrode 52 of the rotating plate 32 oppose each other varies according to the rotation state of the rotating plate 32. A circular boundary 54 formed by an insulator is formed between the first induction electrode 51 and the second induction electrode 52.

In the state in which the first transmission electrode 41, second transmission electrode 42, and four reception electrodes 43A through 43D of the fixed plate 31, and the first induction electrode 51 and second induction electrode 52 formed in the rotating plate 32 are facing each other, capacitors are formed at the opposing portions.

Figure 5:
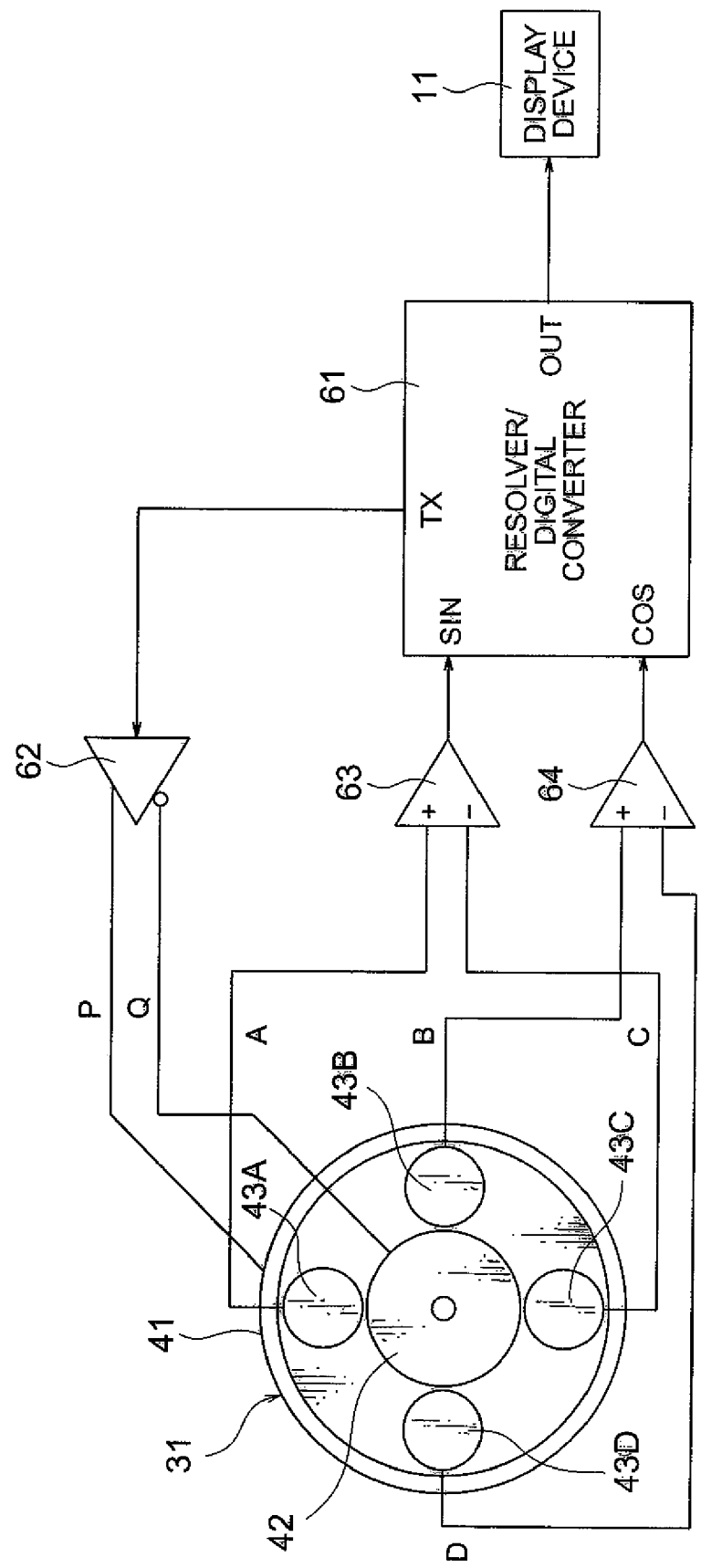
FIG. 5 is a circuit diagram showing the electronic circuit unit for the electrodes of the fixed plate.

The relationship between the aforementioned electronic circuit unit 23 and the transmission electrodes 41, 42 and reception electrodes 43A through 43D provided to the fixed plate 31 will next be described with reference to FIG. 5.

The electronic circuit unit 23 is provided with a transmission circuit for feeding a transmission signal to the first and second transmission electrodes 41, 42, and a resolver/digital converter 61 that includes a signal processing circuit for processing a reception signal obtained from the four reception electrodes 43A through 43D. A resolver/digital converter IC is used in the resolver/digital converter 61. An alternating-current transmitter is internally housed as a transmission circuit inside the resolver/digital converter 61. After the alternating-current transmission output of the alternating-current transmission circuit is amplified to an appropriate size and outputted as the transmission signal TX via a differential amplifier 62, the transmission signal TX is applied as the differential output of a carrier wave between the first transmission electrode 41 and second transmission electrode 42 of the fixed plate 31.

The reception signal ("SIN") obtained by the reception electrode 43A and reception electrode 43C of the fixed plate 31 is received across the two input terminals of a differential amplifier 63, and the reception signal ("COS") obtained by the reception electrode 43B and reception electrode 43D is received across the input terminals of a differential amplifier 64. The output signals of the differential amplifiers 63, 64 are inputted as reception signals "SIN" and "COS," respectively, to the resolver/digital converter 61. The resolver/digital converter 61 functions as a demodulation and interpolation circuit. The following processing of the two reception signals "SIN" and "COS" is performed inside the resolver/digital converter 61.

Each "SIN" and "COS" signal is subjected to differential calculation by a calculator together with an internal feedback signal, and a carrier wave is then removed and the signal is rectified by a synchronous detection circuit. Based on the rectified reception signal, a count is made by a digital counter, the count value is inputted as a parameter for the calculator, and automatic feedback is applied so that the size of rectification of the synchronous detection circuit reaches zero. The value of the digital count at this time indicates the phase relationship of the two signals "SIN" and "COS." A signal relating to the rotation angle is generated from this digital count value, and the signal is fed to the display device 11. The absolute angle (absolute rotational displacement amount) of the rotating plate 32 is indicated by the digital count value displayed in the display unit 35 of the display device 11.

In the above description, the transmission signal TX is indicated by $E_{PQ}=E \sin wt$ (wherein w is the transmission angular frequency), and the two reception signals are indicated by $E_{AC}=kE \sin \theta \sin wt$ and $E_{BD}=kE \cos \theta \sin wt$, wherein $\theta$ is the rotation angle of the rotating plate 32. Since the two reception signals obtained from the four reception electrodes 43A through 43D are thus signals that correspond to the rotation angle $\theta$ of the rotating plate 32, when the signals are processed by the resolver/digital converter 61 that is a demodulation and interpolation circuit, the rotation angle $\theta$ of the rotating plate 32 can be read as an absolute value.

Figure 6:
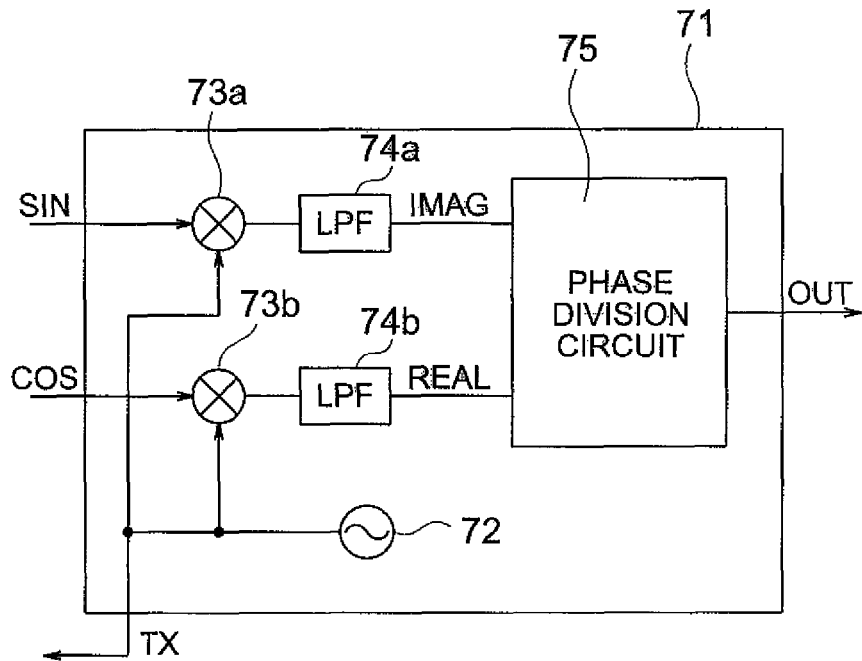
FIG. 6 is a circuit diagram showing the structure of another electronic circuit unit in the present embodiment.

FIG. 6 shows an example of another circuit configuration of the demodulation and interpolation circuit described above. An alternating-current transmitter (transmission circuit) 72 is provided inside this demodulation and interpolation circuit 71. The reception signal TX outputted from the alternating-current transmitter 72 is fed to the differential amplifier 62 as previously described, and also fed to multipliers 73a, 73b. The output signal SIN of the differential amplifier 63 is inputted to the multiplier 73a, and the output signal COS of the differential amplifier 64 is inputted to the multiplier 73b. The carrier wave component is then removed by a synchronous detection circuit composed of the multipliers 73a, 73b and low-pass filters (LPF) 74a, 74b of a subsequent stage, and complex number components "REAL" and "IMAG" composed of two base band signals are extracted. The two differential amplifiers 62, 63, the multipliers 73a, 73b, and the low-pass filters 74a, 74b together form a vector generation circuit. Multiplication processing is then performed by a phase division circuit 75, and a signal is outputted that corresponds to the rotation angle. Sampling circuits may also be used in place of the multipliers 73a, 73b that constitute the synchronous detection circuit if the frequency of the carrier wave is increased.

An equivalent circuit for the sensor unit 22 formed by the fixed plate 31 and the rotating plate 32 will next be described with reference to FIG. 7.

Figure 7:
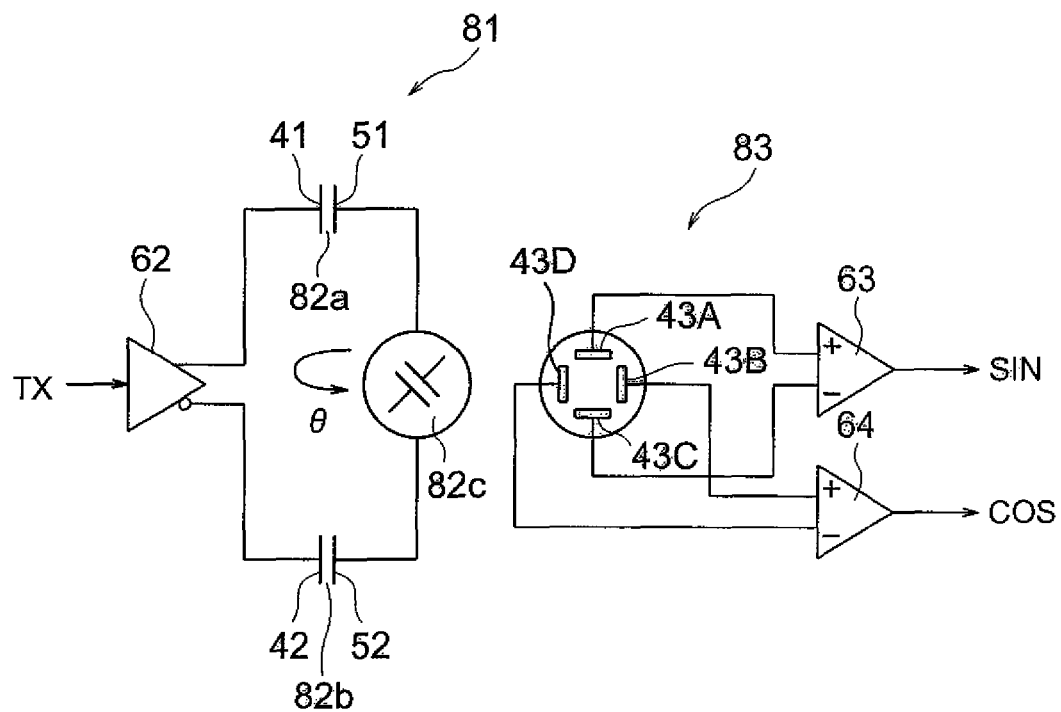
FIG. 7 is an equivalent circuit diagram showing the sensor unit.

In FIG. 7, the circuit unit 81 is an equivalent circuit of the transmission side, and an equivalent circuit of electrostatic capacitors 82a, 82b, 82c is formed by the mutual opposition of the first transmission electrode 41 and second transmission electrode 42 of the fixed plate 31 and the first induction electrode 51 and second induction electrode 52 of the rotating plate 32. In the electrostatic capacitor 82c, the electrode part rotates in accordance with the rotation angle θ of the rotating plate 32, but there is almost no change in the capacitance as such. The reason for this is that even when the rotating plate 32 rotates to a rotation angle θ, there is no change in the opposing surface areas of the first transmission electrode 41 and second transmission electrode 42 with the first induction electrode 51 and second induction electrode 52, respectively. The reception signal outputted from the differential amplifier 62 is applied to the first transmission electrode 41 and the second transmission electrode 42. The circuit unit 83 is an equivalent circuit of the reception side, wherein the four reception electrodes 43A through 43D of the fixed plate 31 are represented, the signals obtained from the first and third reception electrodes 43A, 43C are inputted to the differential amplifier 63, and the signals obtained from the second and fourth reception electrodes 43B, 43D are inputted to the differential amplifier 64.

According to the equivalent circuit shown in FIG. 7, the four reception electrodes 43A through 43D are connected to the input terminals of the differential amplifiers 63, 64, but there is almost no flow of current due to the high input impedance of the differential amplifiers 63, 64, and the reception side has a structure that is electrically separated from the transmission side. Consequently, the four reception electrodes 43A through 43D of the fixed plate 31 substantially function as reception antennas. The electrostatic capacitor 82c rotates, but since a charge is induced in the first induction electrode 51 and second induction electrode 52 that constitute the electrostatic capacitor 82c, the charge is detected by the four reception electrodes 43A through 43D and read as a voltage.

Since the gap between the first induction electrode 51 and the second induction electrode 52 is narrow, and the first transmission electrode 41 and second transmission electrode 42 are superposed in planar fashion over the first induction electrode 51 and second induction electrode 52 across a narrow gap, charges can be adequately accumulated on the surfaces of the first induction electrodes 51, 52 as well.

Figure 8:
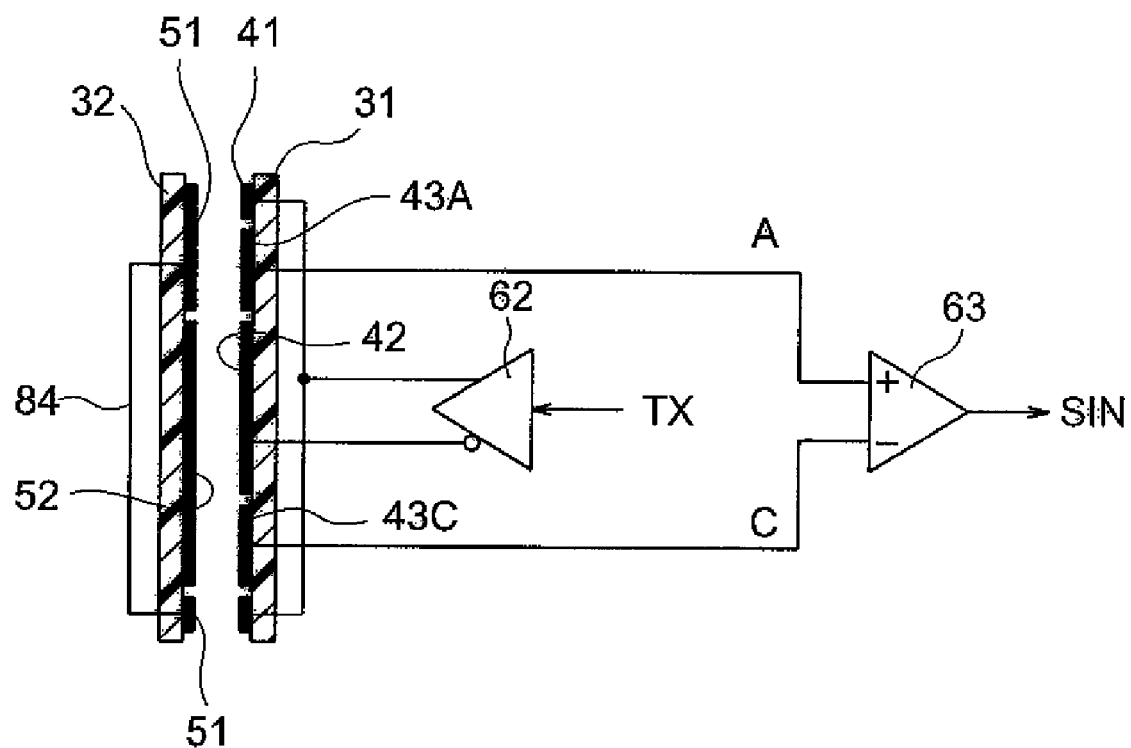
FIG. 8 is a side view showing the sensor unit.

FIG. 8 shows the cross-sectional structure of the sensor unit 22. The sensor unit 22 is composed of the fixed plate 31 and the rotating plate 32 arranged so as to face each other. The rotation axis and other components are not shown in FIG. 8. The opposing surface of the fixed plate 31 is provided with the first transmission electrode 41, the second transmission electrode 42, and the four reception electrodes 43A through 43D. The transmission signal Tx is applied from the differential amplifier 62 to the first transmission electrode 41 and the second transmission electrode 42. Reception signals read from the reception electrodes 43A, 43C, for example, are also inputted to the differential amplifier 63. The first induction electrode 51 and the second induction electrode 52 are connected to the opposing surface of the rotating plate 32. In FIG. 8, the upper and lower first induction electrodes 51 are a single object having the same potential in the same electrical conditions, and are therefore connected in this sense by a conducting wire 84.

Figure 9A:
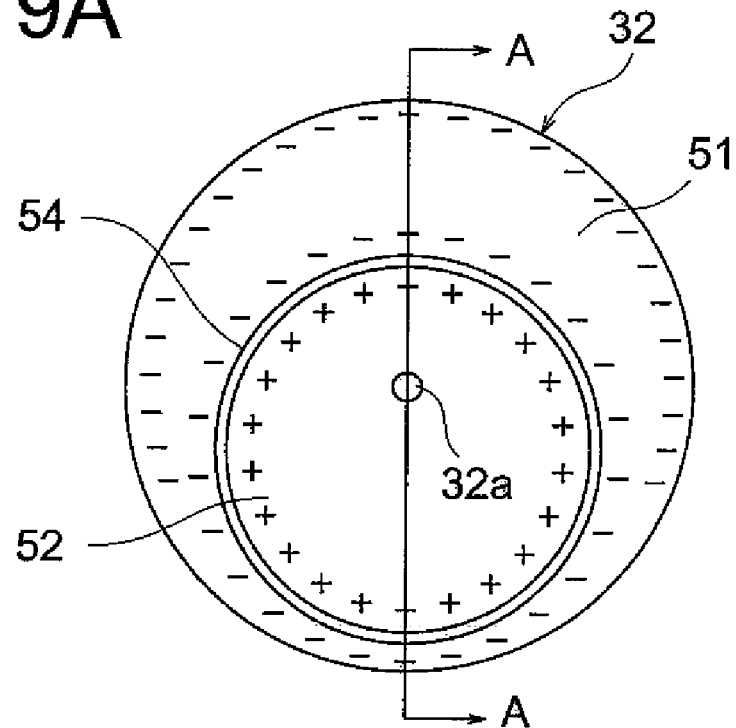
FIGS. 9A and 9B are diagrams showing the operating principle of the sensor unit.
Figure 9B:
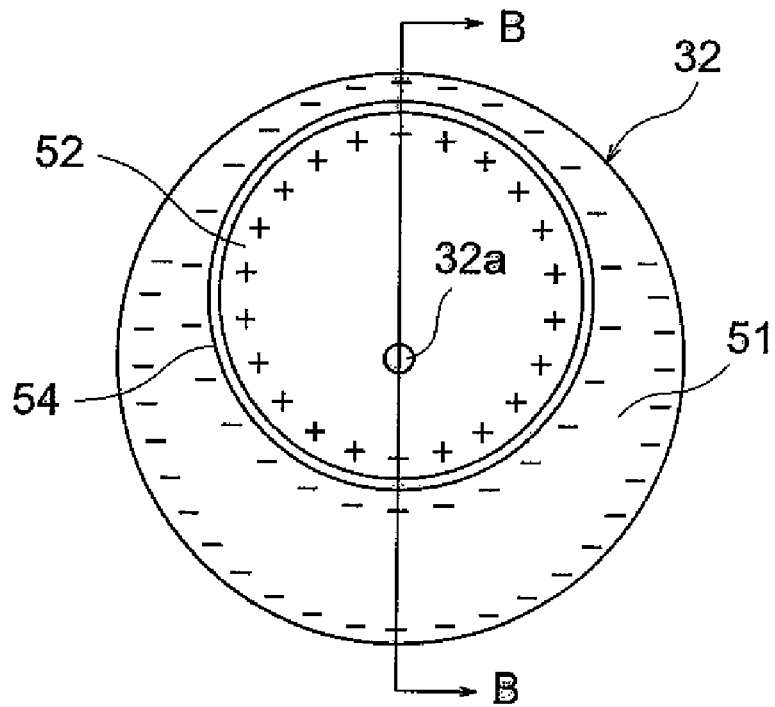
Figure 10A:
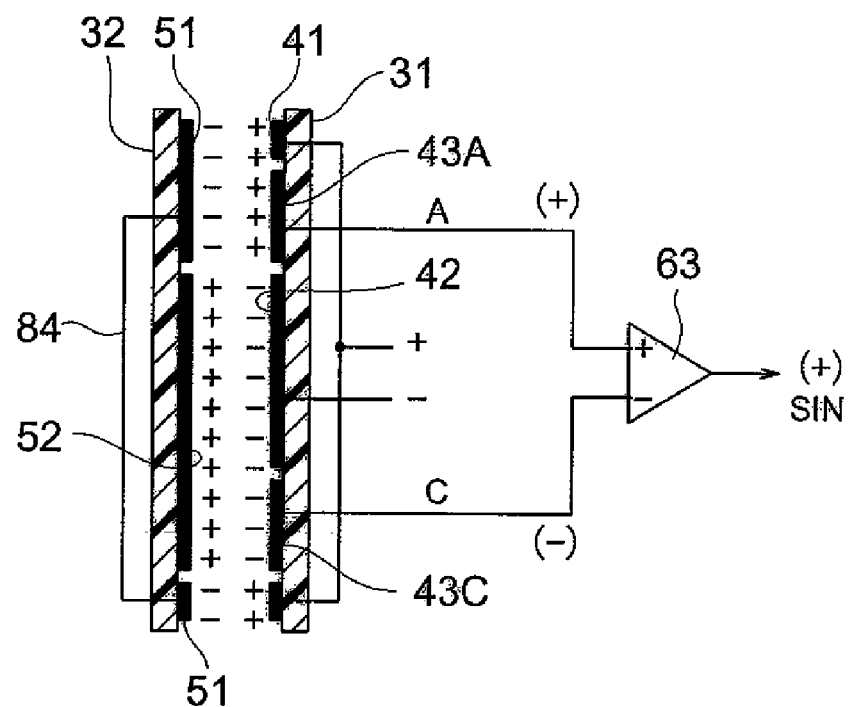
FIG. 10A is a sectional view along line A-A of FIG. 9A.
Figure 10B:
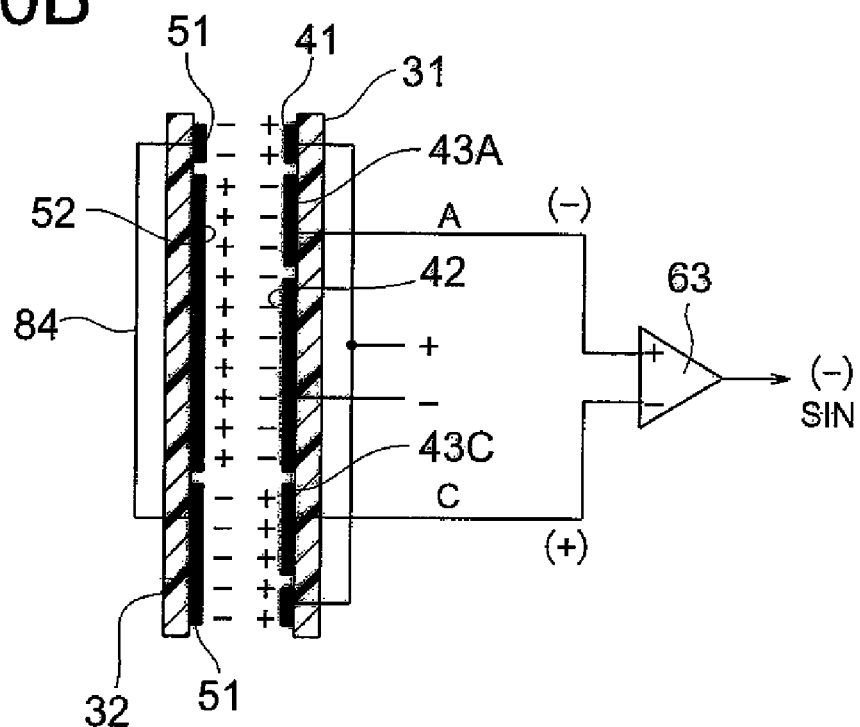
FIG. 10B is a sectional view along line B-B of FIG. 9B.

The operating principle of sensing by the sensor unit 22 will next be described with reference to FIGS. 9A, 9B, 10A, and 10B. FIG. 9A shows a first rotation state of the rotating plate 32 in which the eccentric second induction electrode 52 is in the lowermost position, and FIG. 9B shows a second rotation state of the rotating plate 32 in which the eccentric second induction electrode 52 is in the uppermost position. FIG. 10A is a sectional view along line A-A of FIG. 9A, and FIG. 10B is a sectional view along line B-B of FIG. 9B.

When a positive voltage is applied to the first transmission electrode 41, and a negative voltage is applied to the second transmission electrode 42 as shown in FIGS. 9A and 9B, a negative charge is induced in the first induction electrode 51, and a positive charge is induced in the second induction electrode 52 of the rotating plate 32. The charge distribution state in the first and second induction electrodes 51, 52 in the rotating plate 32 does not change insofar as there is no change in the voltage application state in the first and second transmission electrodes 41, 42. When the rotating plate 32 rotates in this electrical field distribution state, the charges induced in each of the four reception electrodes 43A through 43D in the fixed plate 31 are determined according to the charges of the induction electrodes of the opposing rotating plate 32. For example, in the state shown in FIG. 10A, the reception electrode 43A is charged with a positive charge, and the reception electrode 43C is charged with a negative charge. In the state shown in FIG. 10B, the reception electrode 43A is charged with a negative charge, and the reception electrode 43C is charged with a positive charge. The SIN output in the differential amplifier 63 is thus (+) or (−) according to the rotation position of the rotating plate 32. In other words, when the rotating plate 32 rotates 180 degrees, the SIN output changes from plus to minus. Through the use of this operational characteristic, the rotation position (rotation angle) of the rotating plate 32 can be detected based on the combination of the reception signals of the first and third reception electrodes 43A, 43C, and the combination of the reception signals of the second and fourth reception electrodes 43B, 43D among the reception signals obtained from the four reception electrodes 43A through 43D.

Figure 11:
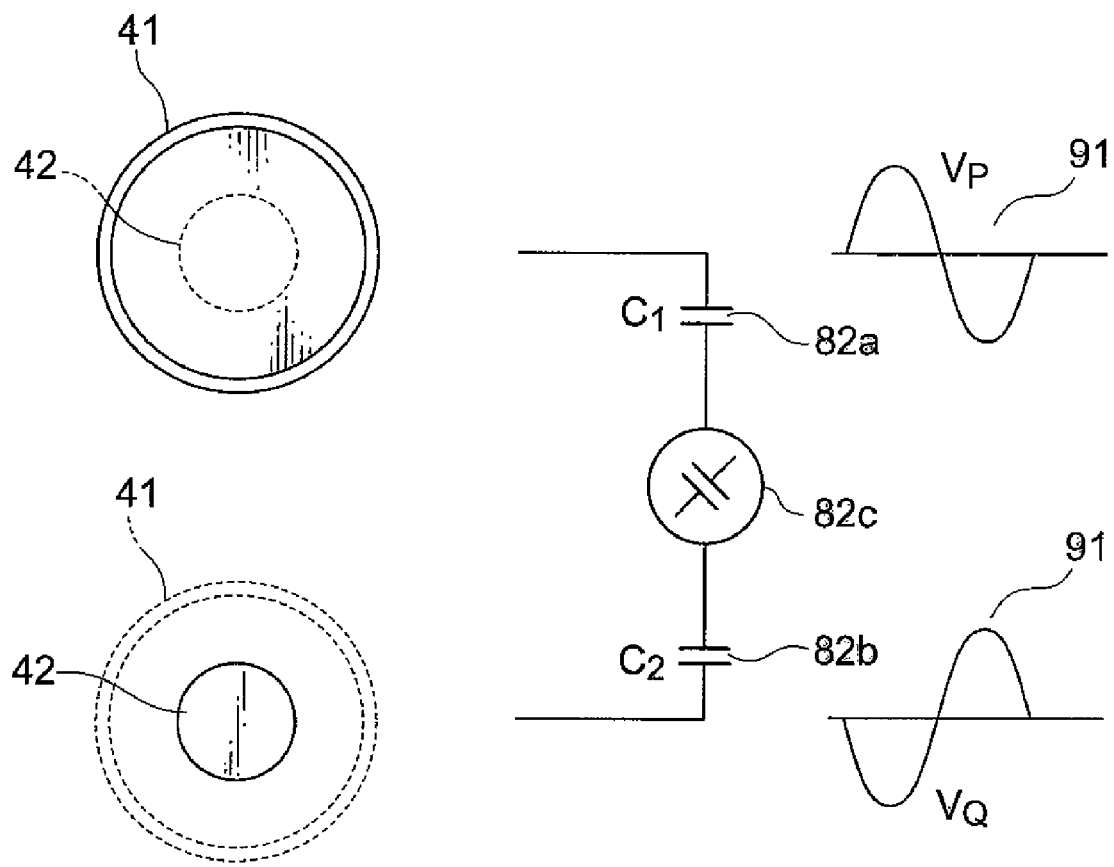
FIG. 11 is a diagram showing the relationship of the first transmission electrode and second transmission electrode in the fixed plate.

The size (surface area) of the first and second transmission electrodes 41, 42 will be described with reference to FIG. 11. Since the usable surface area of the first and second transmission electrodes 41, 42 formed on the fixed plate 31 is limited, the first and second transmission electrodes 41, 42 are formed in the following manner. In FIG. 11, the electrostatic capacitance value $C_1$ is the value of the aforementioned electrostatic capacitor 82a formed by the first transmission electrode 41 and the first induction electrode 51, and the electrostatic capacitance value $C_2$ is the value of the electrostatic capacitor 82b formed by the second transmission electrode 42 and the second induction electrode 52. The electrostatic capacitor indicated by the reference numeral 82c is the electrostatic capacitor of the first and second induction electrodes 51, 52. The series capacitance C ($=C_1 \cdot C_2/(C_1+C_2)$) composed of $C_1$ and $C_2$ is increased in size in order to increase the size of the detection voltage based on the reception electrodes 43A through 43D. The condition whereby the electrostatic capacitance C is the largest occurs when $C_1=C_2$. The surface area of the first transmission electrode 41 and the surface area of the second transmission electrode 42 are therefore made equal.

When the surface area of the first transmission electrode 41 and the surface area of the second transmission electrode 42 are made equal as described above, a "plus" applied voltage $V_P$ is applied to the first transmission electrode 41 and a "minus" applied voltage $V_Q$ is applied to the second transmission electrode 42 as indicated by the reference numerals 91 and 92 in FIG. 11. At this time, since $C_1=C_2$, the average potentials of the induction electrodes 51, 52 are zero, and electrical stabilization effects are demonstrated.

A specific application of the rotary electrostatic encoder will next be described. The same reference numerals are used to refer to elements that are the same as those described in the embodiment described above.

Figure 12:
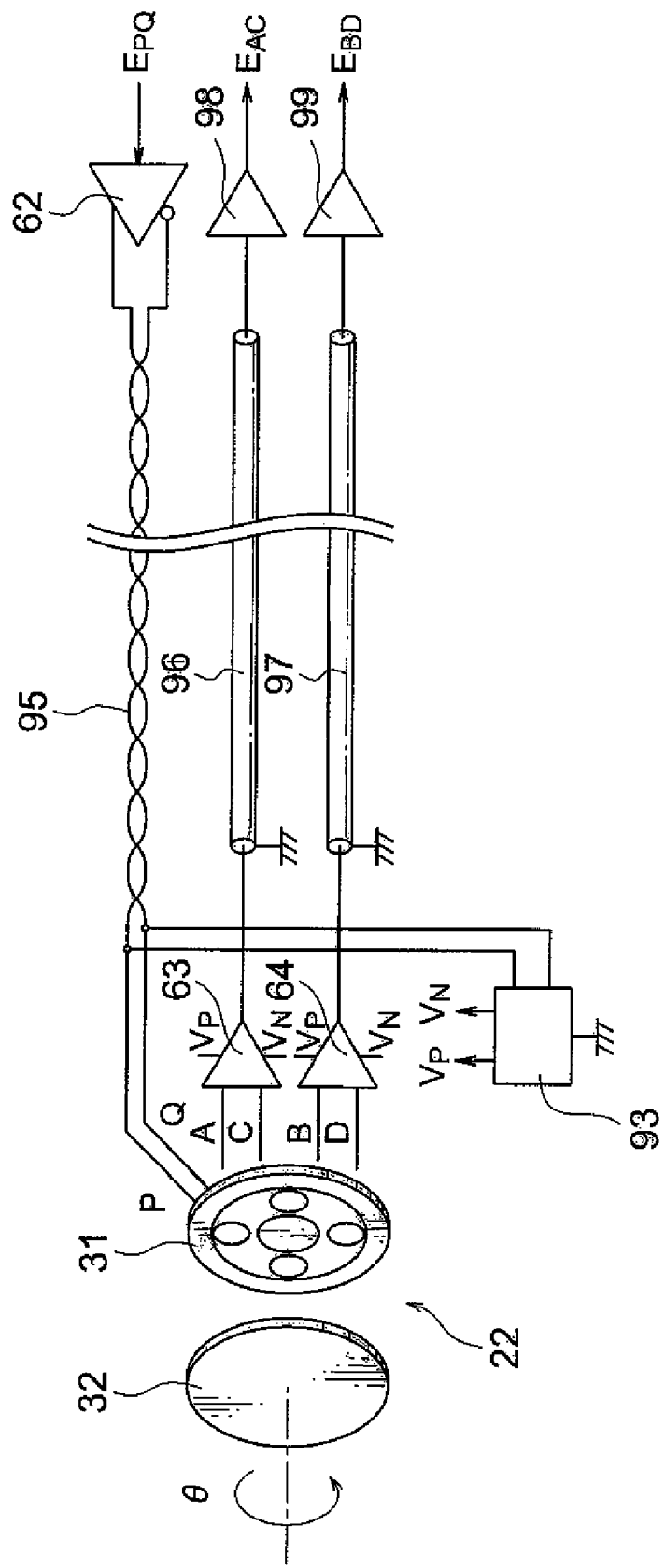
FIG. 12 is a structural diagram showing an example in which the rotary electrostatic encoder of the present invention is used in an endoscope.
Figure 13:
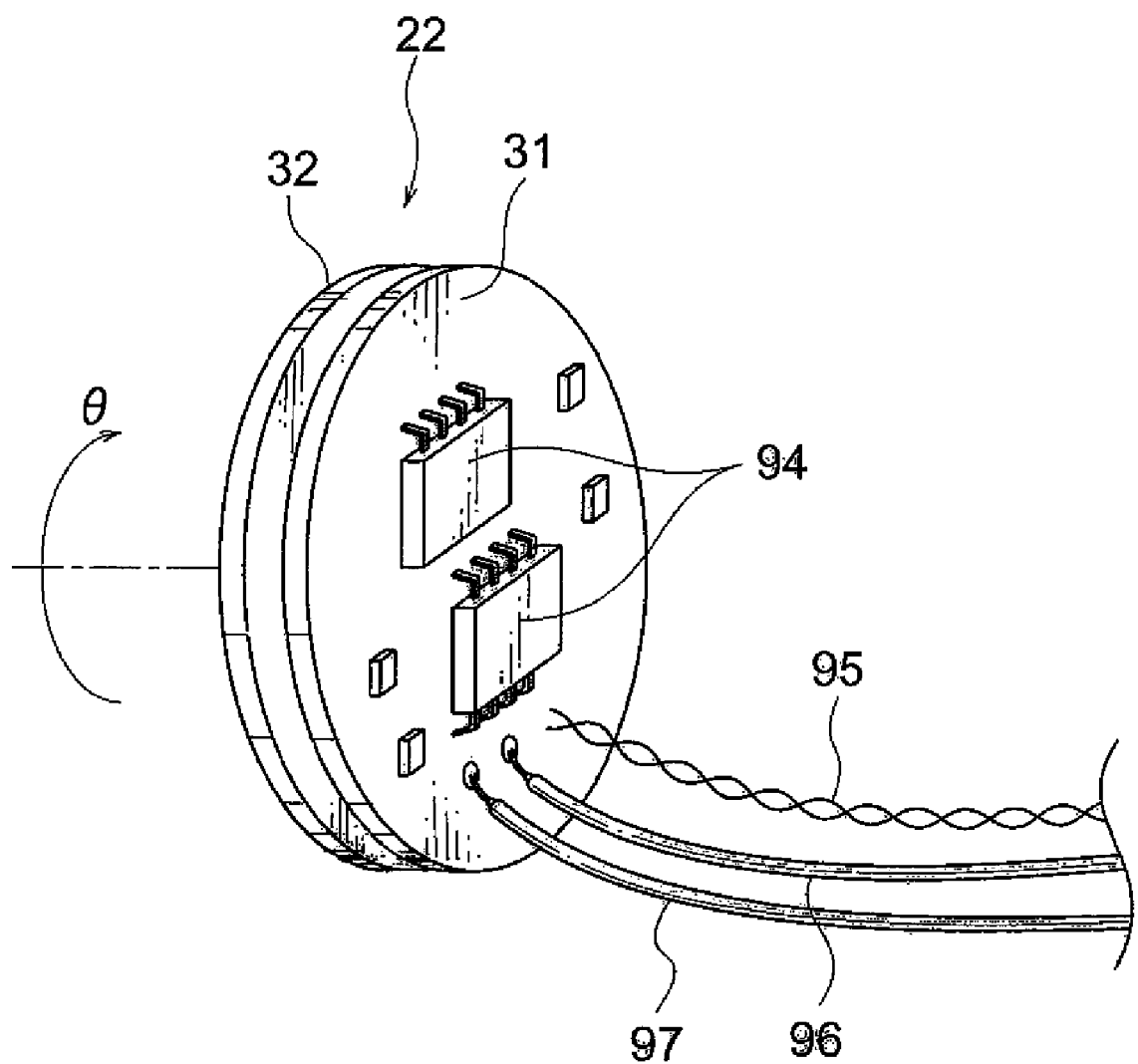
FIG. 13 is a perspective view showing the back surface of the fixed plate of the sensor unit.

FIGS. 12 and 13 show an example in which the rotary electrostatic encoder of the present invention is applied in an endoscope. FIG. 12 shows the overall configuration, and FIG. 13 shows the back surface of the fixed plate 31. The sensor unit 22 composed of the fixed plate 31 and the rotating plate 32 is provided to the distal end of an endoscope. Since the sensor unit 22 is provided to an endoscope, the shape of the entire sensor unit 22 is elongated. The differential amplifiers 63, 64 are provided in the vicinity of the back surface of the fixed plate 31, and an alternating-current/direct-current converter 93 is also provided. The differential amplifiers 63, 64 and the alternating-current/direct-current converter 93 are packaged in semiconductor chips 94 provided to a substrate on the back surface of the fixed plate 31, as shown in FIG. 13.

Since the sensor unit 22 is built into an endoscope, the fixed plate 31 and the rotating plate 32 are small sized, and have a diameter of 10 mm and a thickness of 3 mm, for example.

Wiring that extends from the back surface of the fixed plate 31 is formed by three signal lines that include a twisted pair line 95 for presenting a transmission signal to the first and second transmission electrodes 41, 42 of the fixed plate 31, an output line 96 for carrying out the output signal of the differential amplifier 63, and an output line 97 for carrying out the output signal of the differential amplifier 64. The differential amplifier 62 for amplifying the transmission signal is provided on the outside at the position of the outside end of the twisted pair line 95. Amplifiers 98, 99 for amplifying reception signals are connected at the outside ends of the output lines 96, 97, respectively. Since the rotary electrostatic encoder is used in an endoscope, the twisted pair line 95 and the output lines 96, 97 have adequate lengths. In the alternating-current/direct-current converter 93 on the back surface of the fixed plate 31, the power supply voltages $V_P$, $V_N$ of the differential amplifiers 63, 64 are generated using the transmission signals transmitted in the twisted pair line 95.

Figure 14:
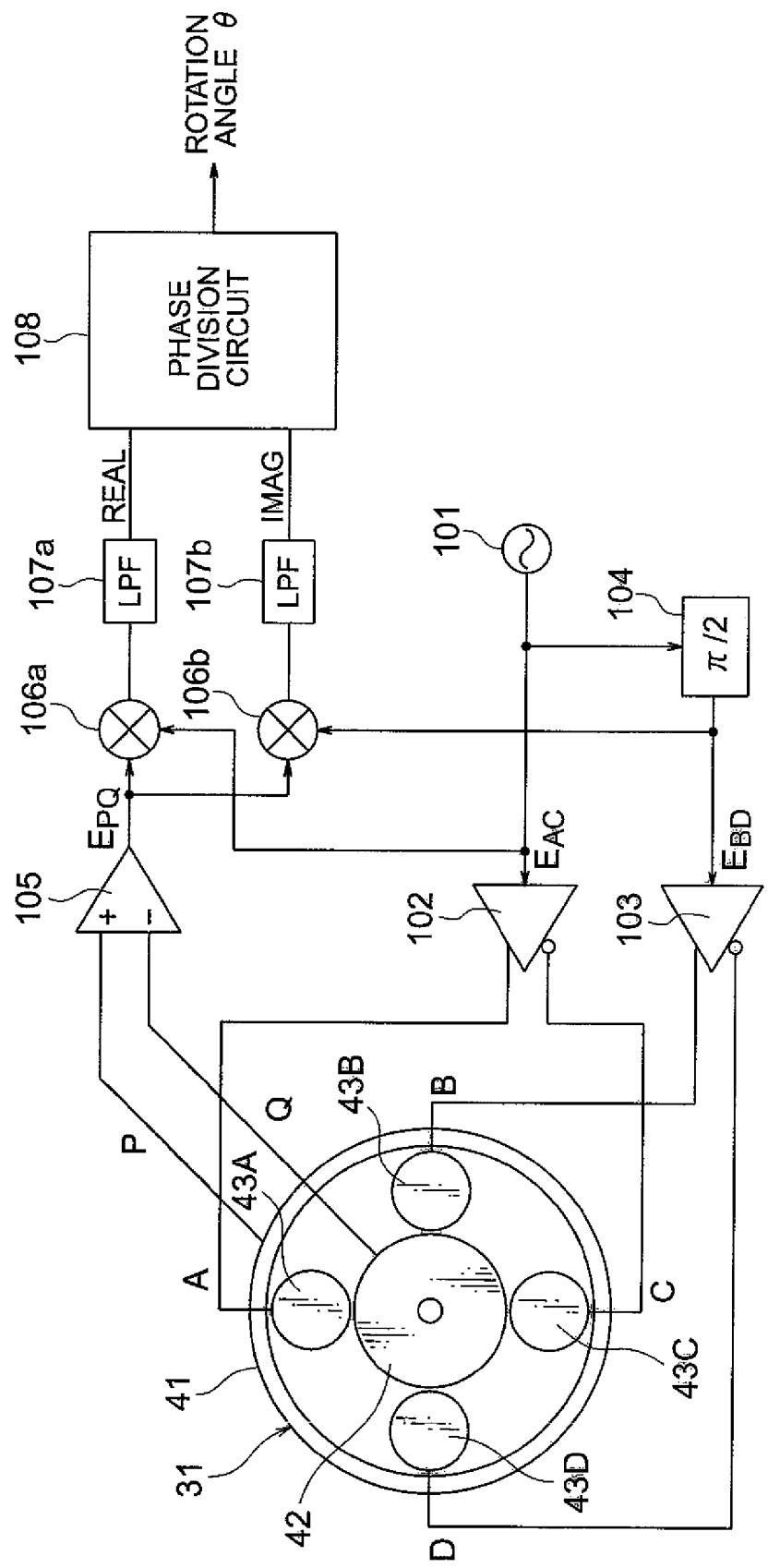
FIG. 14 is a diagram showing a configuration in which the roles of each of the electrodes of the fixed plate are reversed as another embodiment of the rotary electrostatic encoder of the present invention.

FIG. 14 shows another embodiment of the rotary electrostatic encoder of the present invention. FIG. 14 is a view corresponding to FIG. 5. A characteristic feature of the rotary electrostatic encoder of the present embodiment is that the transmission functions and reception functions of the electrodes 41, 42 and 43A through 43D provided to the fixed plate 31 are reversed. The electrode pattern of the fixed plate 31 is the same as the electrode pattern in the previously described embodiment. In the present embodiment, the four reception electrodes 43A through 43D are transmission electrodes, the electrode 41 is a first reception electrode, and the electrode 42 is a second reception electrode. Since the electrodes in the fixed plate 31 have the opposite functions, the configurations of the transmission signal feeding circuit and the reception signal detection circuit are changed, as shown in FIG. 14. The structure, operating principle, and other aspects of the rotating plate 32 and other components are the same as in the previously described embodiment.

In FIG. 14, the reference numeral 101 refers to an alternating-current transmitter (transmission circuit). A transmission signal outputted from the alternating-current transmitter 101 is fed (voltage $E_{AC}$) to a differential amplifier 102 as one route, and fed (voltage $E_{BD}$) to a differential amplifier 103 via a π/2 phase shifter 104 as another route. The transmission signal (amplified voltage $E_{AC}$) outputted from the differential amplifier 102 is applied to the first and third transmission electrodes 43A, 43C. The transmission signal (amplified voltage $E_{BD}$) outputted from the differential amplifier 103 is applied to the second and fourth transmission electrodes 43B, 43D. The differential voltage of the first and second reception electrodes 41, 42 is inputted to a differential amplifier 105. The output voltage ($E_{PQ}$) of the differential amplifier 105 is inputted to multipliers 106a, 106b. The abovementioned voltage $E_{AC}$ is inputted to the multiplier 106a, and the abovementioned voltage $E_{BD}$ is inputted to the multiplier 106b. The carrier wave component is then removed by a quadrature detection circuit composed of the multipliers 106a, 106b and low-pass filters (LPF) 107a, 107b of a subsequent stage, and complex number components "REAL" and "IMAG" composed of two base band signals are extracted. The differential amplifier 105, the multipliers 106a, 106b, and the low-pass filters 107a, 107b together form a vector generation circuit. Multiplication processing is then performed by a phase division circuit 108, and an output signal is outputted that corresponds to the rotation angle.

In the above description, the two types of transmission signals are indicated by $E_{AC}=E \sin wt$ and $E_{BD}=E \cos wt$, and the reception signal is indicated by $E_{PQ}=k_1 E \sin (wt+\theta)$. The real component is indicated by REAL=$k_2 E \cos \theta$, and the imaginary component is indicated by IMAG=$k_3 E \sin \theta$. The carrier wave component is removed from the reception signal by the quadrature detection circuit. The rotation angle θ of the rotating plate 32 as $\theta=\tan^{-1}$ (IMAG/REAL) is read as an absolute value by the phase division circuit 108.

Figure 15:
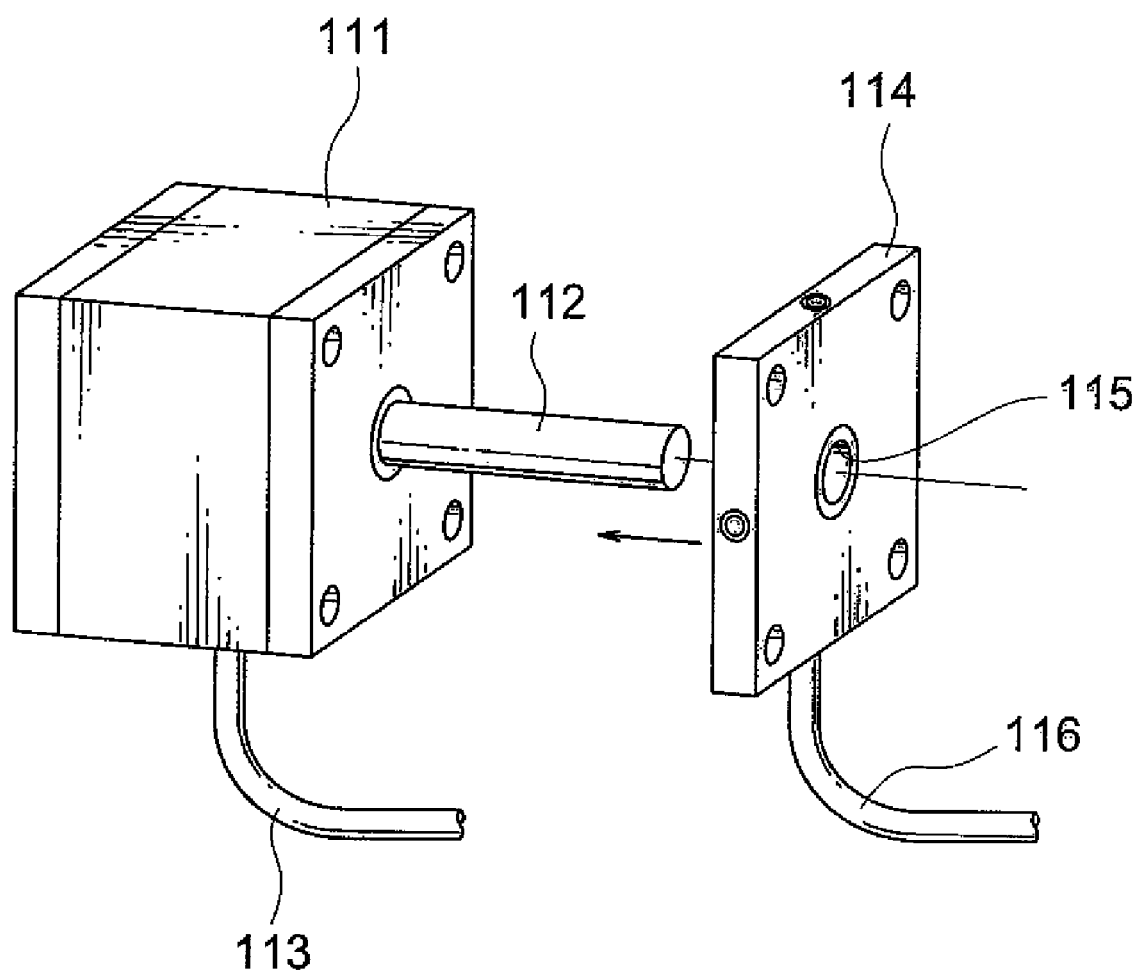
FIG. 15 is a perspective view showing a configuration in which the rotary electrostatic encoder of the present invention is attached to the output shaft of a motor.

An example of an application in which the rotary electrostatic encoder of the present invention is provided to a motor will be described with reference to FIGS. 15 through 17. In FIG. 15, the reference numeral 111 refers to a small-sized motor, 112 refers to the output shaft of the motor 111, and 113 refers to a motor cable. The reference numeral 114 refers to an encoder main body. Since the thickness of the conventional encoder is about 20 mm, it has been impossible to directly attach the encoder main body to the output shaft 112 of a motor 111. Since the sensor part can be endowed with a thin profile in the rotary electrostatic encoder of the present invention, the encoder main body 114 can be made with a thickness of 10 mm or less. The encoder main body 114 can therefore be attached at the output shaft 112 of the motor 111. The output shaft 112 of the motor 111 is inserted into a hole 115 formed in the center of the encoder main body 114, and the encoder main body 114 is fixed to the output shaft 112. The encoder cable 116 is provided to the encoder main body 114.

Figure 16:
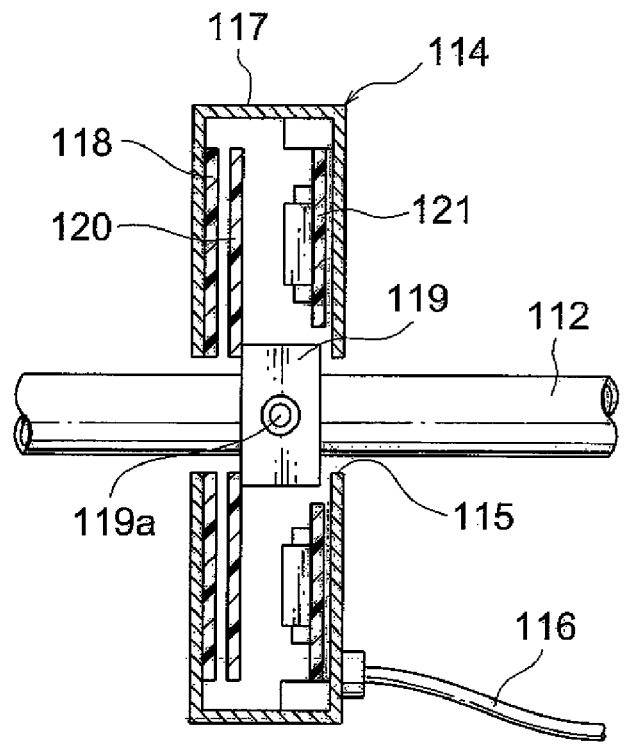
FIG. 16 is a longitudinal sectional view showing the encoder main body.

As shown in FIG. 16, a fixed plate 118 fixed to a main body case 117, and a rotating plate 120 provided with a rotating shaft attachment mechanism 119 are provided inside the encoder main body 114. A packaged circuit substrate 121 provided with an electronic circuit chip is also provided inside the encoder main body 114. The output shaft 112 of the motor 111 is inserted through the rotating shaft attachment mechanism 119, and a screw is attached in a screw hole 119a and tightened, whereby the rotating plate 120 is attached to the output shaft 112. The main body case 117 of the encoder main body 114 is fixed to the front part of the motor 111.

Figure 17:
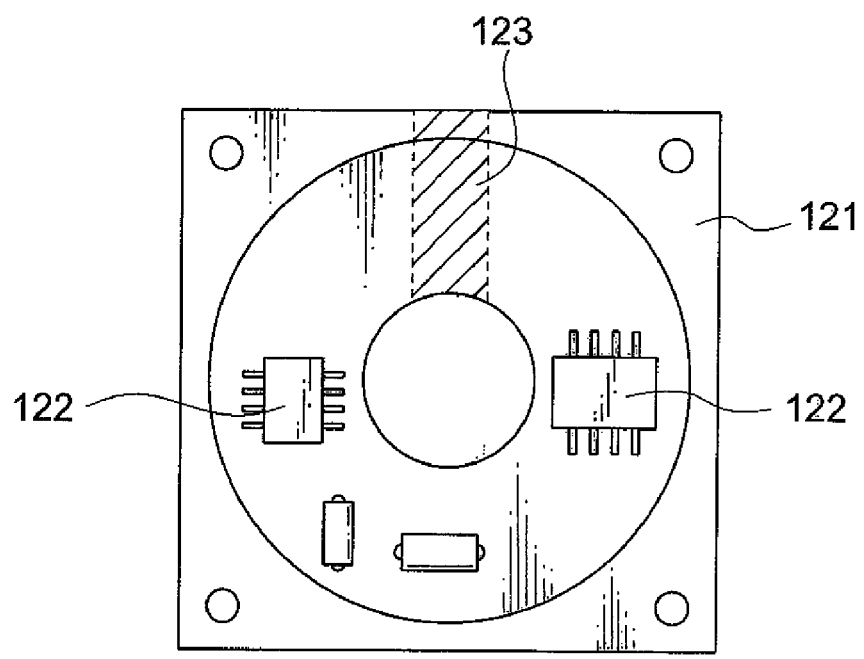
FIG. 17 is a front view showing an example of the arrangement of electronic circuit components of a packaged circuit substrate.

In the structure shown in FIG. 17, the arrangement positions of the electronic circuit chips 122 in the packaged circuit substrate 121 are shown. The hatched region 123 is a region through which an attachment tool is passed when the rotating plate 120 is attached to the output shaft 112, and is a region in which the electronic circuit chips 122 and the like may not be packaged. The tool used for attachment can thereby be placed inside the encoder main body 114.

The configurations, shapes, sizes, and positional relationships described in the embodiments above are schematic representations sufficient for understanding/implementing the present invention, and the numerical values and compositions (materials) of each configuration are given merely as examples. The present invention is thus not limited by the embodiments described, and can be modified in various ways that do not depart from the intended technical scope indicated by the claims.

The sensor unit of the rotary electrostatic encoder of the present invention has a simple structure, and can therefore be built into a small or confined location.

This application relates to and claims priority from Japanese Patent Application No. 2008-211337, filed on Aug. 20, 2008, the entire disclosure of which is incorporated herein by reference.

What is claimed is:

1. A rotary electrostatic encoder comprising:
a disk-shaped fixed element having a first transmission electrode disposed in an external peripheral part; a second transmission electrode disposed in a center part; and four reception electrodes disposed at intervals at 90-degree angles in the circumferential direction between the first transmission electrode and the second transmission electrode;
a disk-shaped rotating element provided parallel and rotatable with respect to the fixed element, the rotating element having a first induction electrode superposed on and facing the first transmission electrode, a portion of the first induction electrode being a protruding eccentric perforated external peripheral part; and a second induction electrode positioned on the inside of the first induction electrode and superposed on and facing the second transmission electrode, a portion of the second induction electrode being a protruding eccentric circular part;
transmission means for applying a transmission signal to the first transmission electrode and the second transmission electrode of the fixed element; and
signal processing means for generating an output signal relating to the absolute rotational displacement of the rotating element on the basis of two signal components outputted from the four reception electrodes of the fixed element.

2. The rotary electrostatic encoder of claim 1, wherein a charge is induced in the first induction electrode and the second induction electrode on the basis of the transmission signal applied between the first transmission electrode and the second transmission electrode, and a potential based on the charge is detected by the four reception electrodes.

3. The rotary electrostatic encoder of claim 1, wherein the signal processing means comprises a resolver/digital converter for converting the two signal components to an angle signal.

4. The rotary electrostatic encoder of claim 1, wherein the signal processing means comprises a circuit for performing synchronous detection of the two signal components at the frequency of the transmission signal outputted from the transmission means and removing a carrier wave component; and a phase division circuit for detecting a vector rotation angle on the basis of the two signal components from which the carrier wave component has been removed.

5. The rotary electrostatic encoder of claim 1, wherein the surface area of the first transmission electrode and the surface area of the second transmission electrode in the fixed element are substantially the same.

6. The rotary electrostatic encoder of claim 1, wherein a first differential amplifier to which reception signals from the first and third reception electrodes of the four reception electrodes are inputted, a second differential amplifier to which reception signals from the second and fourth reception electrodes are inputted, and a converter for generating a power supply voltage of the first and second differential amplifiers from the transmission signal are provided in the vicinity of the fixed element.

7. The rotary electrostatic encoder of any of claims 1 through 6, wherein a motor output shaft attachment mechanism is provided to the rotating element, and the fixed element, the rotating element, the transmission means, and the signal processing means are built into a single case.

8. A rotary electrostatic encoder comprising:
a disk-shaped fixed element having a first reception electrode disposed in an external peripheral part; a second reception electrode disposed in a center part; and four transmission electrodes disposed at intervals at 90-degree angles in the circumferential direction between the first reception electrode and the second reception electrode;
a disk-shaped rotating element provided parallel and rotatable with respect to the fixed element, the rotating element having a first induction electrode superposed on and facing the first reception electrode, a portion of the first induction electrode being a protruding eccentric perforated external peripheral part; and a second induction electrode positioned on the inside of the first reception electrode and superposed on and facing the second reception electrode, a portion of the second induction electrode being a protruding eccentric circular part;
transmission means for applying a four-phase transmission signal to the four transmission electrodes of the fixed element; and
signal processing means for detecting one reception signal from the first and second reception electrodes of the fixed element, performing quadrature detection of the reception signal, and detecting the rotation angle of the rotating element by a vector component of the reception signal.

9. A rotary electrostatic encoder comprising:
a fixed element having a first transmission electrode disposed in an external peripheral part, a second transmission electrode disposed in a center part, and a plurality of reception electrodes;
a rotating element having a first induction electrode and a second induction electrode in which a relative shape facing the reception electrodes varies according to a rotation angle; and
transmission means for applying a transmission signal to the first transmission electrode and the second transmission electrode of the fixed element; wherein
a charge is induced in the first induction electrode and the second induction electrode by electrostatic induction based on the first transmission electrode and the second transmission electrode, potentials that thereby occur in the first induction electrode and the second induction electrode are detected by the plurality of reception electrodes, and an output signal relating to the rotation angle is generated.

10. A rotary electrostatic encoder comprising:

a first electrode plate having a first transmission electrode disposed in an external peripheral part, a second transmission electrode disposed in a center part, and a plurality of reception electrodes disposed between the first transmission electrode and the second transmission electrode; and a second electrode plate having a first induction electrode superposed on and facing the first transmission electrode, a portion of the first induction electrode being a protruding eccentric perforated external peripheral part; and a second induction electrode positioned on the inside of the first induction electrode and superposed on and facing the second transmission electrode, a portion of the second induction electrode being a protruding eccentric circular part; wherein the first electrode plate and the second electrode plate are in a positional relationship of being on the same axis and rotating relative to each other; and a predetermined charge induction state is generated in the reception electrodes according to the relative rotation position of the first and second electrode plates and on the basis of a charge distribution state generated in the first and second transmission electrodes by an applied transmission signal, and a sympathetic charge distribution state of the first and second induction electrodes and on the basis of a signal relating to the absolute rotational displacement between of the first and second electrode plates is generated based on two signal components outputted from the reception electrodes.

* * * * *